(12) United States Patent  (10) Patent No.: US 9,135,213 B2
Taylor et al.  (45) Date of Patent: Sep. 15, 2015

(54) EXTENDING A PROCESSOR SYSTEM WITHIN AN INTEGRATED CIRCUIT AND OFFLOADING PROCESSES TO PROCESS-SPECIFIC CIRCUITS

(75) Inventors: Bradley L. Taylor, Santa Cruz, CA (US); Ting Lu, Austin, TX (US)

(73) Assignee: XILINX, INC., San Jose, CA (US)

( * ) Notice: Subject to any disclaimer, the term of this patent is extended or adjusted under 35 U.S.C. 154(b) by 733 days.

(21) Appl. No.: 13/005,962

(22) Filed: Jan. 13, 2011

(65) Prior Publication Data

US 2012/0185674 A1  Jul. 19, 2012

(51) Int. Cl.
*G06F 15/00* (2006.01)
*G06F 15/76* (2006.01)
*G06F 15/78* (2006.01)
*H03K 19/177* (2006.01)

(52) U.S. Cl.
CPC .......... *G06F 15/7889* (2013.01); *H03K 19/177* (2013.01); *Y02B 60/1207* (2013.01); *Y02B 60/1225* (2013.01)

(58) Field of Classification Search
None
See application file for complete search history.

(56) References Cited

U.S. PATENT DOCUMENTS

| 5,581,482 A | 12/1996 | Wiedenman et al. |
| 5,835,702 A | 11/1998 | Levine et al. |
| 5,867,644 A | 2/1999 | Ranson et al. |
| 5,903,281 A * | 5/1999 | Chen et al. ..................... 345/504 |
| 6,351,724 B1 | 2/2002 | Klassen et al. |
| 6,961,919 B1 * | 11/2005 | Douglass ....................... 716/104 |
| 7,308,564 B1 | 12/2007 | Jenkins, IV |
| 2002/0013892 A1 * | 1/2002 | Gorishek et al. ............... 712/227 |
| 2003/0163298 A1 | 8/2003 | Odom et al. |
| 2006/0248317 A1 * | 11/2006 | Vorbach et al. ................ 712/221 |
| 2009/0271536 A1 * | 10/2009 | Tiennot ........................... 710/28 |
| 2011/0161784 A1 * | 6/2011 | Selinger et al. ................ 714/768 |

FOREIGN PATENT DOCUMENTS

| EP | 1 615 141 A2 | 1/2006 |
| WO | WO 99/61981 A1 | 12/1999 |

OTHER PUBLICATIONS

Taylor, Brad and Wittig, Ralph, "28nm Generation Programmable Families", 7 Series FPGAs, Extensible Processing Platform Family, AMBA AX14 IP, Aug. 8, 2010, pp. 1-25, Xilinx, 2100 Logic Drive, San Jose, CA 95124.
U.S. Appl. No. 12/913,713, Lu, Ting, et al., filed Oct. 27, 2010, Xilinx, Inc., 2100 Logic Drive, San Jose, CA 95124 USA.
U.S. Appl. No. 13/005,941, Taylor, Bradley, L., et al., filed Jan. 13, 2011, Xilinx, Inc., 2100 Logic Drive, San Jose, CA 95124 USA.
U.S. Appl. No. 13/005,994, Taylor, Bradley, L., et al., filed Jan. 13, 2011, Xilinx, Inc., 2100 Logic Drive, San Jose, CA 95124 USA.

(Continued)

*Primary Examiner* — George Giroux
(74) *Attorney, Agent, or Firm* — Kevin T. Cuenot

(57) ABSTRACT

A method of extending a processor system within an integrated circuit (IC) can include executing program code within the processor system implemented within the IC, wherein the IC includes a programmable fabric. The processor system further can be coupled to the programmable fabric. A process can be performed using a process-specific circuit implemented within the programmable fabric in lieu of using the processor system. A result of the process from the process-specific circuit can be made available to the processor system.

20 Claims, 6 Drawing Sheets

(56) References Cited

OTHER PUBLICATIONS

Nass, Rich, "Xilinx puts ARM Core into its FPGAs", EE Times, 2 pp., Apr. 27, 2010, available at http://www.eetimes.com/electronics-products/processors/4115523/Xilinx-puts-ARM-core-into-its-FPGA.

Arnold, J.M., "Software Configurable Processors", Application-Specific Systems, Architectures and Processors, 2006, ASAP'06, International Conference on IEEE, Piscataway, NJ, USA1 Sep. 2006, pp, 45-49.

Conner, D., "Reconfigurable Logic", EDN Electrical Design News, Reed Business Information, Highlands Ranch, CO, US, vol. 41, No. 7, Mar. 28, 1996, pp. 53-56, 58, 60.

Galanis, M.D., et al. "Speedups and Energy Savings of Microprocessor Platforms with a Coarse-Grained Reconfigurable DataPath", Parallel and Distributed Processing Symposium, 2007, IPDPS 2007, IEEE International, IEEE, PI, Mar. 1, 2007, pp. 1-8.

Hauser, J.R. et al., "Garp: a MIPS processor with a reconfigurable coprocessor", Field-Programmable Custom Computing Machines, 1997 Proceedings, the $5^{th}$ Annual IEEE Symposium on NAPA Valley, CA USA Apr. 16-18, 1997, pp. 12-21.

* cited by examiner

EXTENDING A PROCESSOR SYSTEM WITHIN AN INTEGRATED CIRCUIT AND OFFLOADING PROCESSES TO PROCESS-SPECIFIC CIRCUITS

FIELD OF THE INVENTION

One or more embodiments disclosed within this specification relate to integrated circuits (ICs). More particularly, one or more embodiments relate to extending a processor system implemented within an IC.

BACKGROUND

Integrated circuits (ICs) can be implemented to perform specified functions. One type of IC is a programmable IC such as, e.g., a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable including, for example, application specific integrated circuits (ASICs). For instance, another type of programmable IC includes a combination of hard-coded transistor logic and a programmable switch fabric that programmably interconnects the hard-coded transistor logic.

Some modern ICs, including some of the varieties of ICs discussed above, include an embedded processor that is capable of executing program code. The processor can be fabricated as part of the same die that includes the programmable logic circuitry and the programmable interconnect circuitry, also referred to collectively as the "programmable fabric" of the IC. It should be appreciated that execution of program code within a processor is distinguishable from "programming" or "configuring" the programmable fabric that may be available on an IC. The act of programming or configuring programmable fabric of an IC results in the implementation of different physical circuitry as specified by the configuration data within the programmable fabric.

SUMMARY

One or more embodiments disclosed within this specification relate to integrated circuits (ICs) and, more particularly, to extending a processor system implemented within an IC.

An embodiment can include a method of extending a processor system (PS) within an IC. The method can include executing program code within the PS implemented within the IC. The IC also can include a programmable fabric. The PS can be coupled to the programmable fabric. A process can be performed using a process-specific circuit that is implemented within the programmable fabric in lieu of the PS. A result of the process from the process-specific circuit can be made available to the PS.

Another embodiment can include a method of extending a PS within an IC. The method can include executing program code within the PS, wherein the program code specifies a plurality of processes. A process from the plurality of processes specified by the program code can be selected. Configuration data specifying a process-specific circuit that implements the selected process in hardware can be selected. The selected configuration data can be loaded to implement the process-specific circuit within a programmable fabric of the IC. The selected process can be performed using the process-specific circuit in lieu of the processor system.

Another embodiment can include an IC including a PS configured to execute program code and a process-specific circuit implemented within a programmable circuitry of the IC. The process-specific circuit can be coupled to the PS and can be configured to implement a process that is offloaded by the PS. The PS further can be configured to offload the process to the process-specific circuit in lieu of executing program code to perform the process.

DETAILED DESCRIPTION OF THE DRAWINGS

Figure 1:
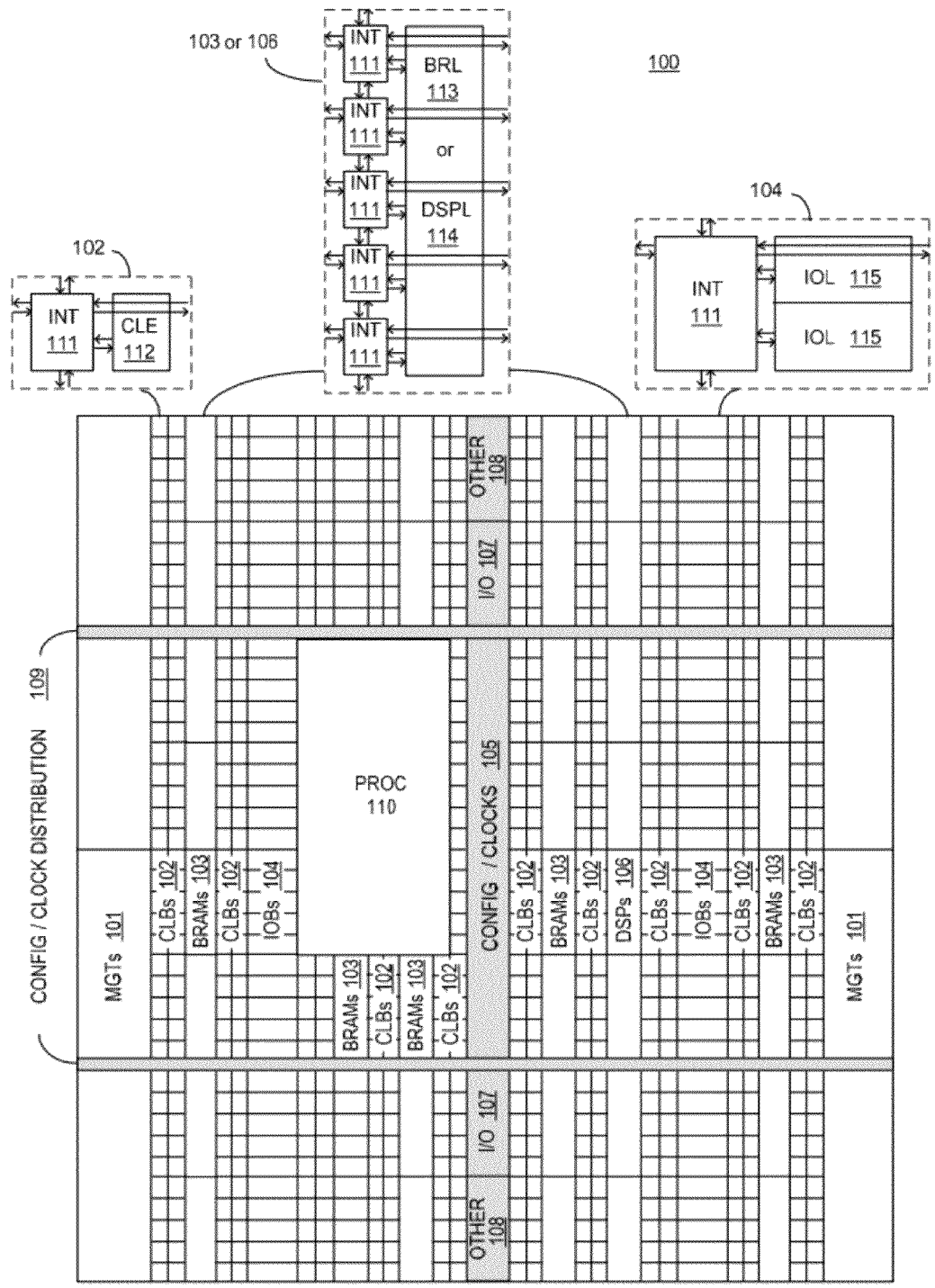
FIG. 1 is a first block diagram illustrating an architecture of an integrated circuit (IC) in accordance with an embodiment disclosed within this specification.

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to extending a processor system implemented within an IC. An IC can be implemented to include a processor system that is coupled to a programmable fabric portion. Functionality of the processor system can be extended by leveraging capabilities of the programmable fabric to operate in conjunction, e.g., in a complementary manner, with the processor system. One or more processes that are, or can be, performed by the processor system, for example, through the execution of program code, can be offloaded to circuitry, e.g., hardware, implemented within the programmable fabric. In some cases, implementing a software process in circuitry requires less time for completion, has less latency, and/or uses less energy than implementing the process through the execution of program code within the processor system.

Accordingly, one or more processes can be selected and offloaded to circuitry implemented within the programmable fabric. The circuitry is specifically designed to implement the offloaded process. For example, particular algorithms or procedures specified in the program code executed by the processor system can be implemented in hardware within the programmable fabric. The processor system can instruct the circuitry, e.g., a process-specific circuit, to perform the process. Thus, the process is performed by the process-specific circuit within the programmable fabric rather than through execution of program code within the processor system.

The selection of the process to be offloaded and the determination as to when to offload a process can be performed by the processor system using a variety of different techniques. In one aspect, such determinations can be predetermined. For example, indicators can be placed within the program code executed by the processor system that specify those processes that are to be offloaded. In another aspect, the processor system can make more dynamic and intelligent decisions relating to process selection and when selected processes are offloaded to the programmable fabric.

FIG. 1 is a first block diagram illustrating an architecture 100 for an IC in accordance with an embodiment disclosed within this specification. Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth.

In some programmable ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an input/output logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die (shown shaded in FIG. 1) is used for configuration, clock, and other control logic. Horizontal areas 109 extending from this column are used to distribute the clocks and configuration signals across the breadth of the programmable IC.

Some programmable ICs utilizing the architecture illustrated in FIG. 1 include additional logic blocks that disrupt the regular columnar structure making up a large part of the programmable IC. The additional logic blocks can be programmable blocks and/or dedicated circuitry. For example, a processor block depicted as PROC 110 spans several columns of CLBs and BRAMs.

PROC 110 can be implemented as a hard-wired processor that is fabricated as part of the die that implements the programmable fabric of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 110 can include one or more cores, e.g., central processing units, cache memories, a memory controller, unidirectional and/or bidirectional interfaces configurable to couple directly to I/O pins of the programmable IC and/or couple to the programmable fabric of the programmable IC. The phrase "programmable fabric" can refer to programmable circuitry within an IC, e.g., the various programmable or configurable circuit blocks or tiles described herein, as well as the interconnect circuitry that selectively couples the various circuit blocks, tiles, and/or elements according to configuration data that is loaded into the IC.

Using the various interfaces available within PROC 110, processes defined by program code executed by PROC 110 can be offloaded to circuitry implemented within the programmable fabric. Configuration data loaded into an IC having an architecture as described, for example, can implement one or more process-specific circuits (PSCs) within the programmable fabric. PROC 110 can select one or more processes that are associated with hardware implementations, i.e., PSCs or configuration data specifying the PSCs, and offload the process for implementation within the programmable fabric.

FIG. 1 is intended to illustrate only an exemplary architecture that can be used to implement a programmable IC. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual programmable IC, for example, more than one adjacent column of CLBs is typically included wherever the CLBs appear, to facilitate the efficient implementation of a user circuit design. The number of adjacent CLB columns, however, can vary with the overall size of the programmable IC.

Figure 2:
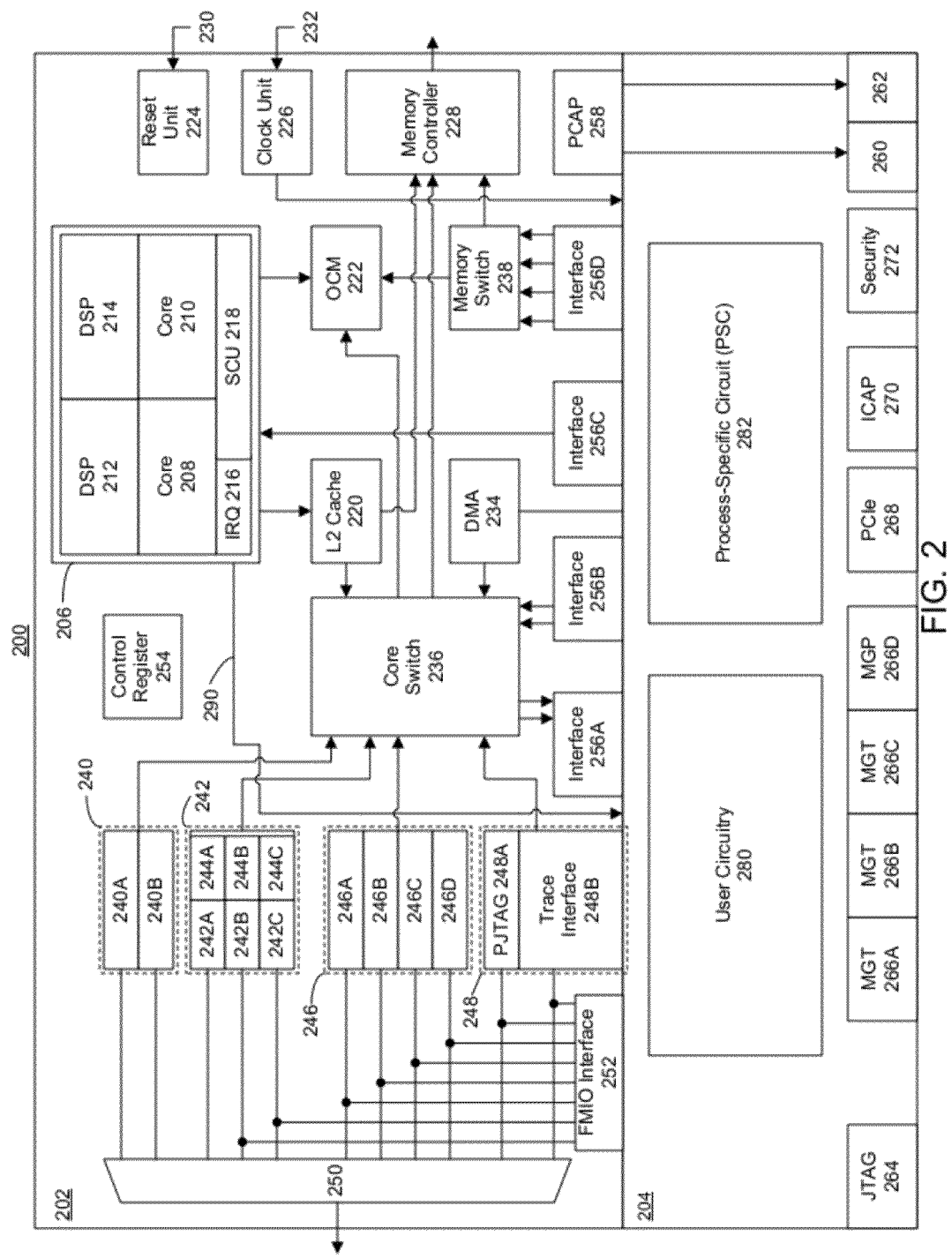
FIG. 2 is a second block diagram illustrating an IC in accordance with another embodiment disclosed within this specification.

FIG. 2 is a second block diagram illustrating an IC 200 configured in accordance with another embodiment disclosed within this specification. IC 200 can be implemented using any of a variety of different architectures that include a processor system (PS) 202 coupled to a programmable circuitry such as, e.g., a programmable fabric 204. For example, IC 200 can be implemented using an architecture that is the same as, or similar to, that of architecture 100 of FIG. 1, though this need not be the case. In general, IC 200 illustrates the various interfaces that can be used to couple PS 202 with circuitry implemented within programmable fabric 204 in greater detail to facilitate offloading of software-based processes from PS 202 to hardware.

In the example shown in FIG. 2, PS 202 is illustrated as occupying approximately two-thirds of the die of IC 200, while programmable fabric 204 is shown as occupying approximately one-third of the same die. FIG. 2 is not, however, intended to be a scale representation of IC 200. Rather, FIG. 2 is provided for purposes of illustration and is not intended as a limitation of the one or more embodiments disclosed within this specification.

In general, PS 202 is implemented as a hard-wired system within IC 200. To the extent that various components or modules within PS 202 are coupled by lines, e.g., signal or communication links, that have arrows, such arrows are intended to illustrate the direction or flow of control. In this regard, a signal illustrated as a line with a directional arrow generally indicates that control over the signal is exerted by the source component from which the arrow emanates rather than the target component. The arrows, in general, are not intended to indicate one-way flow of data or directionality of the signal. In this regard, signals can be implemented as bi-directional signals or communication links despite the presence of the directional arrow.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal, as noted, may represent bi-directional communication between two, or more, components connected by that signal or wire as the case may be.

As shown, PS 202 can include a core complex 206. Core complex 206 can include cores 208 and 210, DSP units 212 and 214, an interrupt request unit (IRQ) 216, and a snoop control unit (SCU) 218. Each of cores 208 and 210 can include a level 1 (L1) cache (not shown) embedded therein. While any of a variety of different types of processor cores and/or DSP units can be used, in an embodiment disclosed herein, cores 208 and 210 each can be implemented as an ARM Cortex™-A9 type of processor core with each having a 32 KB instruction cache and a 32 KB data cache. DSP units 212 and 214 can be implemented in the form of NEON™ media and/or floating point processing engines. Each DSP unit 212 and 214 can provide 128-bit vector-based DSP functions. The ARM Cortex™-A9 processor cores and the NEON™ media and/or floating point processing engines are available from ARM Holdings of Cambridge, UK (ARM).

Within PS 202, core complex 206 is coupled to a level 2 (L2) cache 220 and an on-chip memory (OCM) 222. L2 cache 220 can be implemented as a 256 KB memory. OCM 222 also can be implemented as a 256 KB memory. Cores 208 and 210 and DSP units 212 and 214 can directly access L2 cache 220 and OCM 222. In general, OCM 222 provides local memory that is available to PS 202 and/or to programmable fabric 204, e.g., circuits implemented within programmable fabric 204. By comparison, L2 cache 220, which is also a memory, functions as a cache for PS 202. Accordingly, L2 cache 220 can store small blocks or portions of data, e.g., 256 bits, which are effectively copies of data bits stored in RAM, e.g., execution memory off-chip. If, for example, a read request is issued for data stored in L2 cache 220, the data is read from L2 cache 220 as opposed to being retrieved from the RAM.

PS 202 further can include a reset unit 224, a clock unit 226, and a memory controller 228. Reset unit 224 can receive one or more signals originating from a source external to IC 200, e.g., signal 230. Signal 230 can instruct reset unit 224 to reset PS 202 and/or one or more or all of the components within PS 202. Clock unit 226 also can receive one or more reference signals, e.g., signal 232, from a source external to IC 200. Clock unit 226, for example, can be implemented as, or include, phase-lock loop circuitry capable of synchronizing to received signal 232. Clock unit 226 can generate one or more clock signals of one or more different frequencies that can be distributed throughout PS 202 (not shown). Further, clock unit 226 can generate one or more clock signals of one or more different frequencies that can be distributed to programmable fabric 204 for use by circuits implemented therein.

Memory controller 228 can be implemented to communicate with one or more different types of RAMs located external to IC 200, e.g., "off-chip." For example, memory controller 228 can be implemented to access, e.g., read and/or write, various types of memory including, but not limited to, Dual Data Rate (DDR) 2, DDR3, Low Power (LP) DDR2 types of memory, whether 16-bit, 32-bit, 16-bit with ECC, etc. The list of different memory types with which memory controller 228 is able to communicate is provided for purposes of illustration only and is not intended as a limitation or to be exhaustive.

PS 202 also can include a direct memory access (DMA) interface 234 that is coupled to a core switch 236 and to programmable fabric 204. PS 202 further includes a memory switch 238 that couples to one of interfaces 256, i.e., interface 256D, to be described within this specification in greater detail, OCM 222, and memory controller 228.

Core switch 236 can route signals among various components of PS 202 as shown. In an embodiment, core switch 236 can be coupled directly to an internal bus of PS 202 (not shown). In such an embodiment, each other component within PS 202 that connects with core switch 236 can be coupled to core switch 236 through the internal bus. For example, interfaces 240, 242, 246, and 248 each can couple to core switch 236 via the internal bus. The internal bus can be implemented as any of a variety of different buses such as, for example, an Advanced Peripheral Bus (APB).

In general, PS 202 can include approximately four categories of I/O. PS 202 can provide flash memory type interfaces, higher performance interfaces, lower performance interfaces, and debugging interfaces. Regarding the first category of I/O, PS 202 can include one or more flash memory interfaces 240 illustrated as 240A and 240B. For example, one or more of flash memory interfaces 240 can be implemented as a Quad-Serial Peripheral Interface (QSPI) configured for 4-bit communication. One or more of flash memory interfaces 240 can be implemented as a parallel 8-bit NOR/SRAM type of interface. One or more of flash memory interfaces 240 can be implemented as a NAND interface configured for 8-bit and/or or 16-bit communication. It should be appreciated that the particular interfaces described are provided for purposes of illustration and not limitation. Other interfaces having different bit widths can be used.

Regarding the second category of I/O, PS 202 can include one or more interfaces 242 providing a higher level of performance than the first category of I/O. Each of interfaces 242A-242C can be coupled to a DMA controller 244A-244C respectively. For example, one or more of interfaces 242 can be implemented as a universal serial bus (USB) type of interface. One or more of interfaces 242 can be implemented as a gigabit Ethernet type of interface. One or more of interfaces 242 can be implemented as a Secure Digital (SD) type of interface.

Regarding the third category of I/O, PS 202 can include one or more interfaces 246 such as interfaces 246A-246D that provide a lower level of performance than the second category of I/O. For example, one or more of interfaces 246 can be implemented as a General Purpose I/O (GPIO) type of interface. One or more of interfaces 246 can be implemented as a Universal Asynchronous Receiver/Transmitter (UART) type of interface. One or more of interfaces 246 can be implemented in the form of a Serial Peripheral Interface (SPI) bus type of interface. One or more of interfaces 246 can be implemented in the form of a Controller-Area-Network (CAN) type of interface. One or more of interfaces 246 can be implemented in the form of a Triple Timer Counter (TTC) and/or a Watchdog Timer (WDT) type of interface.

Regarding the fourth category of I/O, PS 202 can include one or more debug interfaces 248 such as processor JTAG (PJTAG) port or interface 248A and a trace interface 248B. PJTAG port 248A can provide an external debug interface for PS 202. Trace interface 248B can provide a port to receive debug, e.g., trace, information from programmable fabric 204, a port to send debugging data of PS 202 out to programmable fabric 204, and a cross trigger port. The cross trigger port allows circuitry within programmable fabric 204 to trigger debug functions such as trace within PS 202. Similarly, PS 202 can initiate debug functions within circuits implemented within programmable fabric 204.

As shown, each of interfaces 240, 242, 246, and 248 can be coupled to a multiplexer 250. Multiplexer 250 provides a plurality of outputs that can be directly routed or coupled to external pins of IC 200, e.g., balls of the package within which IC 200 is disposed. For example, a plurality of I/O pins of IC 200, e.g., 53 pins, can be shared among interfaces 240, 242, 246, and 248. A user can configure multiplexer 250, as part of PS 202, to select which of interfaces 240-248 are to be used and, therefore, coupled to I/O pins of IC 200 via multiplexer 250.

As shown, interfaces 242-248 also can be selectively coupled to a fabric multiplexer input/output (FMIO) interface 252. Accordingly, based upon user configuration of IC 200 and, more particularly, PS 202, any one of I/O categories two, three, or four, i.e., interfaces 242-248, can be coupled to programmable fabric 204 of IC 200 via FMIO interface 252. This allows data being communicated via any one of interfaces 242-248 to be routed to circuitry within programmable fabric 204 for further processing and/or monitoring.

Control register 254 can be configured to control various, if not most, aspects of PS 202. One or more commands can be written to control register 254 to control or regulate operation of PS 202. For example, circuits within programmable fabric 204 can write to control register 254 through an interface such as interface 256B, to be described herein in further detail. Control register 254 can control or regulate functions such as controlling intellectual property (IP) enable resets, setting clock frequencies generated by clock unit 226, specifying I/O drive strength, and other system level functions. Control register 254 can regulate additional functions such as powering down PS 202, powering down or deactivating particular interfaces of PS 202 independently, or the like. Control register 254 can be accessed through a bus such as, for example, an APB (not shown), that couples control register 254 to core switch 236.

PS 202 also can include one or more interfaces 256, depicted as interfaces 256A-256D, that couple directly with programmable fabric 204. In an embodiment, one or more or all of interfaces 256 can be implemented in accordance with the AMBA AXI Protocol Specification (AXI) as published by ARM. For example, each of interfaces 256 can be implemented in conformance with the AMBA AXI Protocol Specification v. 2.0, which is incorporated herein by reference in its entirety. In general, AXI is a high performance, high frequency interface that is suitable for submicron interconnect.

Referring again to FIG. 2, interfaces 256A and 256B, for example, each can be implemented to provide two, 32-bit channels that couple programmable fabric 204 with core switch 236. Interface 256A can be implemented as a general-purpose master interface. Interface 256A, for example, can be used to perform general purpose transfers of data from PS 202 and/or a DMA controller therein, to programmable fabric 204. Interface 256B can be implemented as a general-purpose slave interface. For example, interface 256B can be used to perform general purpose data transfer between PS 202 and programmable fabric 204.

Through interfaces 256A-256B and core switch 236, circuits implemented within programmable fabric 204 can access various ones of interfaces 240, 242, 246, and 248. Through interfaces 256A and/or 256B, in combination with core switch 236, circuits within programmable fabric 204 further can access OCM 222 directly and off-chip memory through memory controller 228, etc.

Interface 256C can be implemented as a 64-bit slave interface that couples programmable fabric 204 directly with core complex 206 and, more particularly, SCU 218. Through interface 256C and SCU 218, circuits implemented within programmable fabric 204 are provided with direct access to the L1 cache within each of cores 208 and 210, IRQ 216, L2 cache 220, and OCM 222. Accordingly, circuits within programmable fabric 204 can read and/or write to such memories and detect interrupts generated or asserted within core complex 206. In addition, signal 290 can represent one or more interrupts from programmable fabric 204 that can be provided to IRQ 216 as ports or signals and/or one or more copies of interrupts from PS 202, and in particular from core complex 206, that can be provided to programmable fabric 204 as ports or signals. In another embodiment, interface 256C can provide coherent access to core complex 206 that would be suitable for use by circuits functioning as co-processors. For example, a soft processor implemented within programmable fabric 204 in the form of a PSC, e.g., PSC 282, can communicate with PS 202 via interface 256C.

Interface 256D can be implemented to provide a plurality, e.g., four, 64-bit slave interfaces. Interface 256D can be used to exchange large amounts of data between PS 202 and circuits implemented within programmable fabric 204 efficiently. As shown, interface 256D provides circuits implemented within programmable fabric 204 with access to OCM 222 via memory switch 238 and access to off-chip memory via memory switch 238 and memory controller 228.

PS 202 further includes a processor configuration access port (PCAP) 258. As shown, PCAP 258 can be coupled to a configuration controller 260 and a system monitor block 262 located within programmable fabric 204. Configuration controller 260 and system monitor block 262 can be implemented in the form of hard-wired circuitry. Configuration controller 260 is responsible for writing configuration data to configuration memory cells thereby physically implementing circuitry specified by the configuration data within programmable fabric 204. System monitor block 262 can perform functions such as analog-to-digital conversion, voltage monitoring, current monitoring, and/or temperature monitoring.

Programmable fabric 204 can be implemented to include one or more programmable circuit blocks that can be coupled together using programmable interconnect circuitry. The programmable circuit blocks and the programmable interconnect circuitry can be configured to implement one or more different physical circuits, e.g., user circuitry 280 and/or PSC 282, based upon configuration data loaded into IC 200. It should be appreciated that programmable fabric 204, with the exception of various hard-wired circuits implemented therein, is not operational or functional until configuration data is loaded within configuration memory causing physical circuitry to be implemented within programmable fabric 204.

Programmable fabric 204 also can be configured to implement one or more interfaces in the form of hard-wired circuits. For example, a JTAG interface 264, one or more MGTs 266A-266D, a Peripheral Component Interconnect Express (PCIe) interface 268, an Internal Configuration Access Port (ICAP) 270, and a security port 272 can be included as hard-wired circuits despite being located within the programmable fabric portion of IC 200. The various interfaces described with reference to programmable fabric 204 illustrate exemplary interfaces that can be implemented and are not intended to be restrictive or limiting as to the one or more embodiments disclosed within this specification.

For example, configuration data can be loaded into IC 200 and received by a configuration controller 260. In an embodiment, configuration data can be received through PS 202, which can control the configuration process of IC 200. Configuration controller 260 can load the configuration data received from PS 202 via PCAP 258 within configuration memory (not shown) of IC 200. Different physical circuits such as user circuitry 280 and/or PSC 282 can be implemented or formed within programmable fabric 204 as specified by the particular configuration data loaded into the configuration memory of IC 200. It should be appreciated that the loading of configuration data in this manner, due to the use of hard-wired circuitry, requires no initial configuration of programmable fabric 204. Circuits implemented within programmable fabric 204, inconsequence of loading configuration data, though physical circuits, typically are referred to as "soft" in that the circuitry is formed within the programmable fabric rather than being hard-wired or otherwise fixed within IC 200.

PSC 282, as well as user circuitry 280, can be coupled to PS 202 through any of the various interfaces described. Direct access can be provided via interfaces 256, while further access to PS 202 can be facilitated through FMIO interface 252. It should be appreciated that the particular functionality and process being offloaded to PSC 282 will, in general, determine the type of interface necessary for communicating with PS 202.

Figure 3:
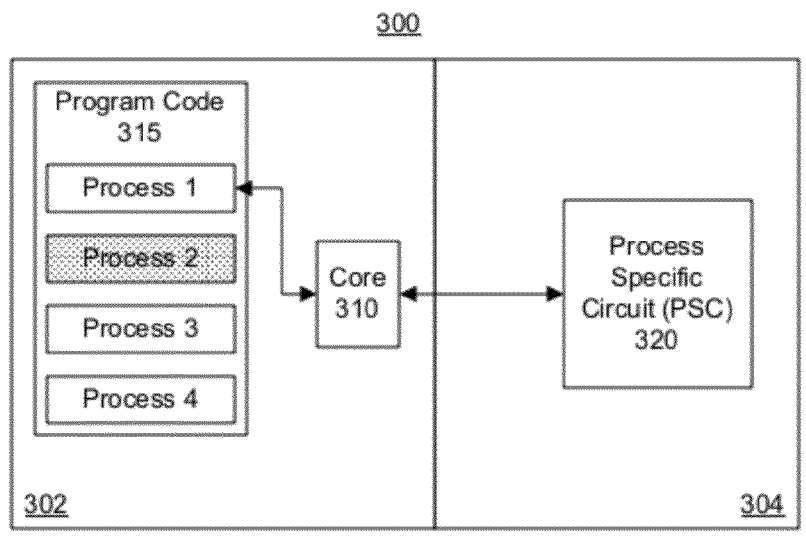
FIG. 3 is a third block diagram illustrating an IC configured for extending a processor system in accordance with another embodiment disclosed within this specification.

FIG. 3 is a third block diagram illustrating an IC 300 configured for extending a processor system in accordance with another embodiment disclosed within this specification. IC 300 can be implemented substantially as described with reference to IC 200 of FIG. 2. FIG. 3, however, illustrates an abstracted view of IC 300 to illustrate the offloading a software-based process from PS 302 to circuitry such as PSC 320 within programmable fabric 304.

FIG. 3 shows a core 310 executing program code 315. Program code 315 can include, or specify, one or more different processes. For purposes of illustration, program code 315 is shown to include process 1, process 2, process 3, and process 4. Process 2 is shaded to illustrate that process 2 is associated with a PSC, in this example PSC 320. As shown, PSC 320 is implemented within programmable fabric 304. Accordingly, core 310 can be programmed to determine that a PSC exists for process 2. Rather than execute process 2, core 310 can offload the processing that would otherwise be performed through the execution of program code by PS 302 to programmable fabric 304. Core 310, for example, can arrange to make any source data necessary for performing process 2 available to PSC 320 as input. Once processing by PSC 320 is complete, any result data generated by PSC 320 can be provided back to PS 302 for processing or use by core 310.

In an embodiment, process 2 can be identified or otherwise marked within program code 315 for implementation within programmable fabric 304. For example, core 315 can identify an indicator that specifies that process 2 is not to be executed, but rather performed in hardware by PSC 320. In another embodiment, process 2 can simply be instructions that inform core 315 to offload a particular process to PSC 320 or perform a process using PSC 320. In that case, process 2 need not include actual program code specifying the process to be performed. Rather, during development, a decision can be made to implement process 2 within hardware rather than in software. Process 2 effectively can be replaced with an indicator instructing PS 302 to offload the process to PSC 320. In still another embodiment, the decision to offload process 2 to PSC 320 can be made dynamically, e.g., during operation of IC 300 in the field.

Whether the decision to implement a particular process in the form of a PSC is performed during the design cycle of the system implemented within IC 300 or dynamically in the field by PS 302, the decision can be made based upon one or more different cost measures or simply "costs." The costs can be evaluated to determine a cost of execution that reflects one or more costs associated with performing the process in software in PS 302. One or more costs further can be evaluated to determine a cost of implementation for offloading the process to PSC 320 in programmable fabric 304. In general, when the cost of implementation is less than the cost of execution, or less than the cost of execution by a predetermined amount or percentage, a process can be offloaded to a corresponding PSC.

In an embodiment, the cost of execution and the cost of implementation each can include a time component, or a power component, or both a time component and a power component in some combination. In some cases, offloading a process from PS 302 to programmable fabric 304 is beneficial since the PSC can perform the process faster than PS 302 can execute the process. In other cases, the PSC can perform the process using less energy than is used by PS 302 to execute the process. In still other cases, the PSC can perform the process in less time and use less energy than PS 302. The cost of execution and the cost of implementation can be calculated and compared to identify those situations in which offloading of a process results in a time savings, or a power savings, or a savings of both time and power.

In an embodiment, the time component can be measured in terms of latency. For example, the decision whether to offload a process can depend upon whether the PSC can perform the process with less latency than were PS 302 to execute the process. In one example, one or more PSCs can be implemented within programmable fabric 304 that each can be configured to handle or process an interrupt provided to IRQ 216 of FIG. 2. One or more interrupts of PS 302 can be exposed to circuitry, e.g., one or more PSCs, in programmable fabric 304 via the IRQ. Upon detecting an interrupt, the interrupt can be handled by the PSC within programmable fabric 304 as opposed to being handled through execution of exception handling program code within PS 302. Handling interrupts using a PSC can reduce system latency by allowing PS 302 to respond to other tasks or requests.

Figure 4:
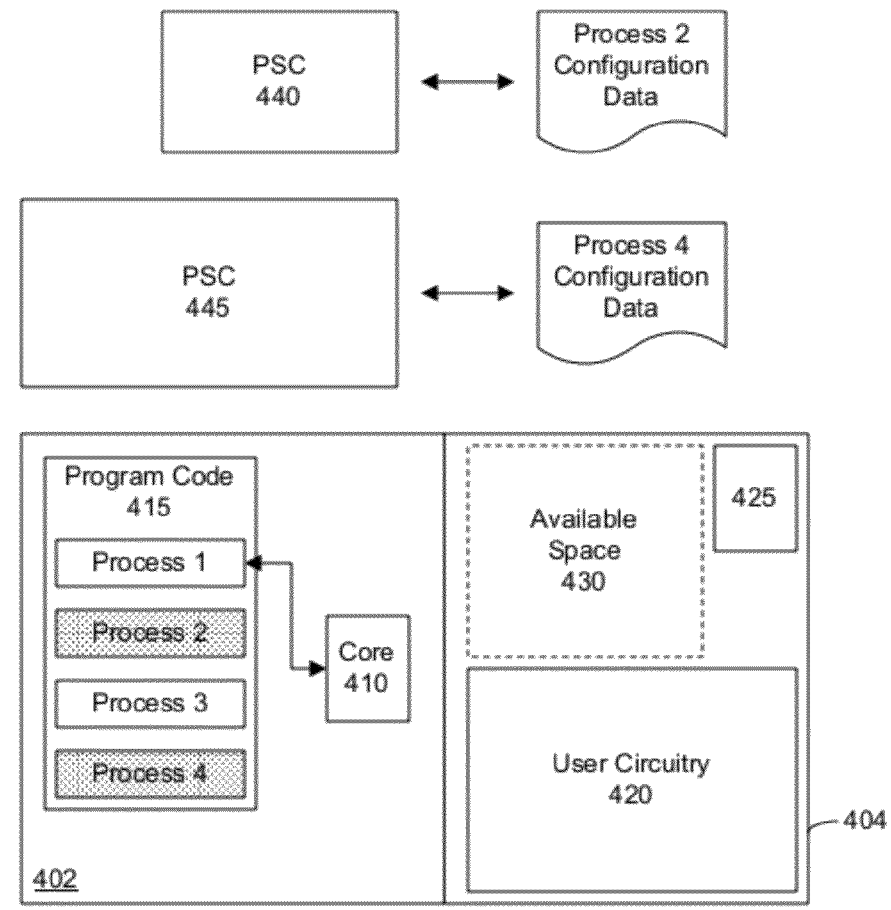
FIG. 4 is a fourth block diagram illustrating an IC configured for extending a processor system in accordance with another embodiment disclosed within this specification.

FIG. 4 is a fourth block diagram illustrating an IC 400 configured for extending a processor system in accordance with another embodiment disclosed within this specification. IC 400 can be implemented substantially as described with reference to IC 200 of FIG. 2. FIG. 4, like FIG. 3, illustrates an abstracted view of IC 400 to demonstrate the offloading of a software-based process from PS 402 to circuitry within programmable fabric 404.

FIG. 4 shows a core 410 executing program code 415. Program code 415 can include, or specify, one or more different processes. For purposes of illustration, program code 415 is shown to include process 1, process 2, process 3, and process 4. Processes 2 and 4 are shaded to illustrate that both processes are associated with corresponding configuration data specifying PSCs. Process 2 is associated with process 2 configuration data. Process 4 is associated with process 4 configuration data.

For example, process 2 is implemented in program code and also is associated with configuration data shown as "process 2 configuration data." When process 2 configuration data is loaded into IC 400, PSC 440 is implemented within programmable fabric 404. Process 4 is implemented in program code and also is associated with configuration data shown as "process 4 configuration data." When process 4 configuration data is loaded into IC 400, PSC 445 is implemented within programmable fabric 404.

PSC 440 and PSC 445 are shown as blocks to illustrate the area that would be required to implement each respective circuit within programmable fabric 404. The area required to implement PSCs 440 and 445 can be known and stored as part of program code 415 or stored within a memory elsewhere within IC 400 for use when required.

In an embodiment, each PSC can be implemented in programmable fabric during development so that the size of the PSC can be estimated or determined. In another embodiment, the size of the PSC can be estimated or calculated based upon a relationship between one line of program code (LOC) or instruction to an average number of components of the programmable fabric needed to implement that LOC or instruction. For example, each instruction can require a particular number of LUTs to implement. Thus, the size of the PSC for a given process can be determined as the LOCs for the process multiplied by the number of hardware units needed to implement each LOC.

As shown, programmable fabric 404 includes user circuitry 420 representing a user circuit design already implemented within programmable fabric 404. IC 400 also includes a configuration controller 425 that is configured to load configuration data into configuration memory cells to implement circuitry within programmable fabric 404. Available space 430 represents an unused portion of programmable fabric 404. The size of available space 430 also can be known, or determined, and made available to core 410. For example, configuration controller 425 can calculate available space 430 and make the information available to PS 402 through a standardized application programming interface (API).

Accordingly, in an embodiment, when deciding whether to implement a particular process such as process 2 within programmable fabric 404 in lieu of executing process 2, core 410 can determine whether available space 430 within programmable fabric 404 is sufficient to implement PSC 440. As illustrated, available space 430 is large enough to implement PSC 440, but not PSC 445.

It should be appreciated that the amount of available space 430 can change during operation of IC 400, for example, as IC 400 undergoes dynamic partial reconfiguration, complete reconfiguration, or the like from time-to-time while in the field. Accordingly, whether a given process can be implemented in hardware can depend upon various factors already briefly discussed as well as the amount of available space 430 at the particular time that offloading of a process may be desired.

When determining whether to offload a particular process to the programmable fabric, as noted, a cost of execution can be compared with a cost of implementation. In general, the cost of implementation and the cost of execution each can depend upon time, e.g., the speed at which the process can be performed, latency, power, e.g., the amount of power consumed or needed to perform the process, or some combination of both time, latency, and/or power.

The cost of execution can be calculated using a variety of different techniques. In one aspect, for example, the cost of execution can be determined according to the number of LOCs of the process to be executed. In another aspect, the cost of execution can be determined according to the number of operations and/or the type of each respective operation to be executed. For example, an addition operation can be known to require a first amount of time and a first amount of power to execute. A particular DSP operation can be known to require a second amount of time and a second amount of power to execute. Information regarding power consumption and execution time generally is available from the manufacturer or provider of the processor or PS.

Thus, for a given processor or PS, the time needed to execute a LOC or execute a particular operation is generally known. Similarly, the amount of power required to execute a LOC or execute a given type of operation is generally known. Each process of the program code to be executed by the PS that can be offloaded can be associated with a profile that can specify the cost of execution. The cost of execution can reflect power consumption, time to execute, latency, or a combination of two or more of power consumption, time to execute, and/or latency.

The cost of implementation also can be determined using a variety of different techniques. For example, cost of implementation can depend upon one or more operations that must be performed by the PS to setup offloading of the process. To setup offloading, for example, the PS may first need to ensure that source data needed by the PSC as input is available. Thus, the PS may be required to read data from a source memory, compute the source data, write the source data to a destination memory from which the PSC can access the source data, and/or perform one or more address translations. In this regard, the setup performed by the PS can have power and/or time expenditures that must be included in the cost of implementation.

In addition, the amount of time needed to access, e.g., read and/or write, a memory can depend upon the location of that memory. The same is true with respect to power consumption. In general, a memory internal to the PS can be accessed in less time and with less of a power expenditure than a memory external to the IC, for example, a RAM accessed through the memory controller. Further, L1 cache can be accessed in less time than L2 cache, and either L1 or L2 cache can be accessed in less time than OCM.

When the PSC is not yet implemented within the programmable fabric, additional time is required for the configuration data to be loaded into configuration memory to implement the PSC. The time required to implement the PSC can depend upon, for example, the amount of configuration data to be loaded and the speed at which the configuration can be loaded from an external source. The time required and the power required to implement the PSC within the programmable fabric can be estimated and contribute to the cost of implementation.

In terms of the actual processing to be performed by the PSC, the PSC can be profiled for power consumption and time needed to complete the offloaded process according to factors such as the number and/or type of operations to be performed, the particular circuits that are to perform the operations, etc. Typically, power consumption and speed can be determined based upon the number of operations to be performed by the PSC, the type of operations to be performed by the PSC, and the particular circuit elements of the PSC that are to implement the operations of the offloaded process.

Cost of implementation also can depend upon the manner in which results of the offloaded process are returned from the PSC to the PS. As noted, the particular memory in which results are stored and the communication channel through which the results are sent to the PS can influence both time and power and, therefore, the cost of implementation.

In addition to time and power, as illustrated in FIG. 4, sufficient space within the programmable fabric must be available to implement a PSC. For example, each process can be associated with a cost of execution, a cost of implementation, and configuration data specifying the PSC for the process. The cost of implementation can include, or specify, an estimate of the area required to implement the PSC within the programmable fabric. Thus, in one aspect, cost of execution for each process can be stored. One or more factors of the cost of implementation of the process can be stored. As noted, however, one or more other factors may need to be calculated dynamically, e.g., during operation in the field, due to changing conditions within the IC itself, e.g., whether the PSC is already implemented, whether the available space within the programmable fabric is adequate, etc.

In general, cost of implementation and/or the cost of execution can be calculated by summing the various individual cost component(s) described. As noted, one or more of the cost component(s) can be weighted, e.g., multiplied by a factor, that either increases the significance of the particular cost component or reduces the significance of the particular cost component within the overall cost of implementation and/or execution calculation. The different methods and techniques for determining cost of execution and cost of implementation are provided for purposes of illustration and, as such, are not intended to limit the one or more embodiments disclosed within this specification.

In an embodiment, the process that is offloaded to a PSC can be one that involves input of data to the IC and the PS or output of data from the IC and/or PS. The PSC effectively can implement an I/O peripheral of the PS. For example, a PSC can be configured to accept incoming data, perform initial processing of that data, and store the data within a RAM that is accessible by the PS. Accordingly, the PS can access that data from the RAM when needed. Storage of the data within the RAM, as well as the pre-processing, can be performed by the PSC without involvement of the PS. Similarly, data that is stored in memory such as a RAM can be output by a PSC without involvement of the PS. The PSC can read data from the designated memory, perform any processing if need be, and output the resulting data without involvement of the PS. The PS, for example, can notify the PSC of the data to be output using one or more of the techniques described within this specification. One example illustrating use of a PSC as an I/O peripheral as described above is in the context of video processing. The PSC can perform one or more preprocessing tasks and store the resulting data in memory for use by the PS.

Figure 5:
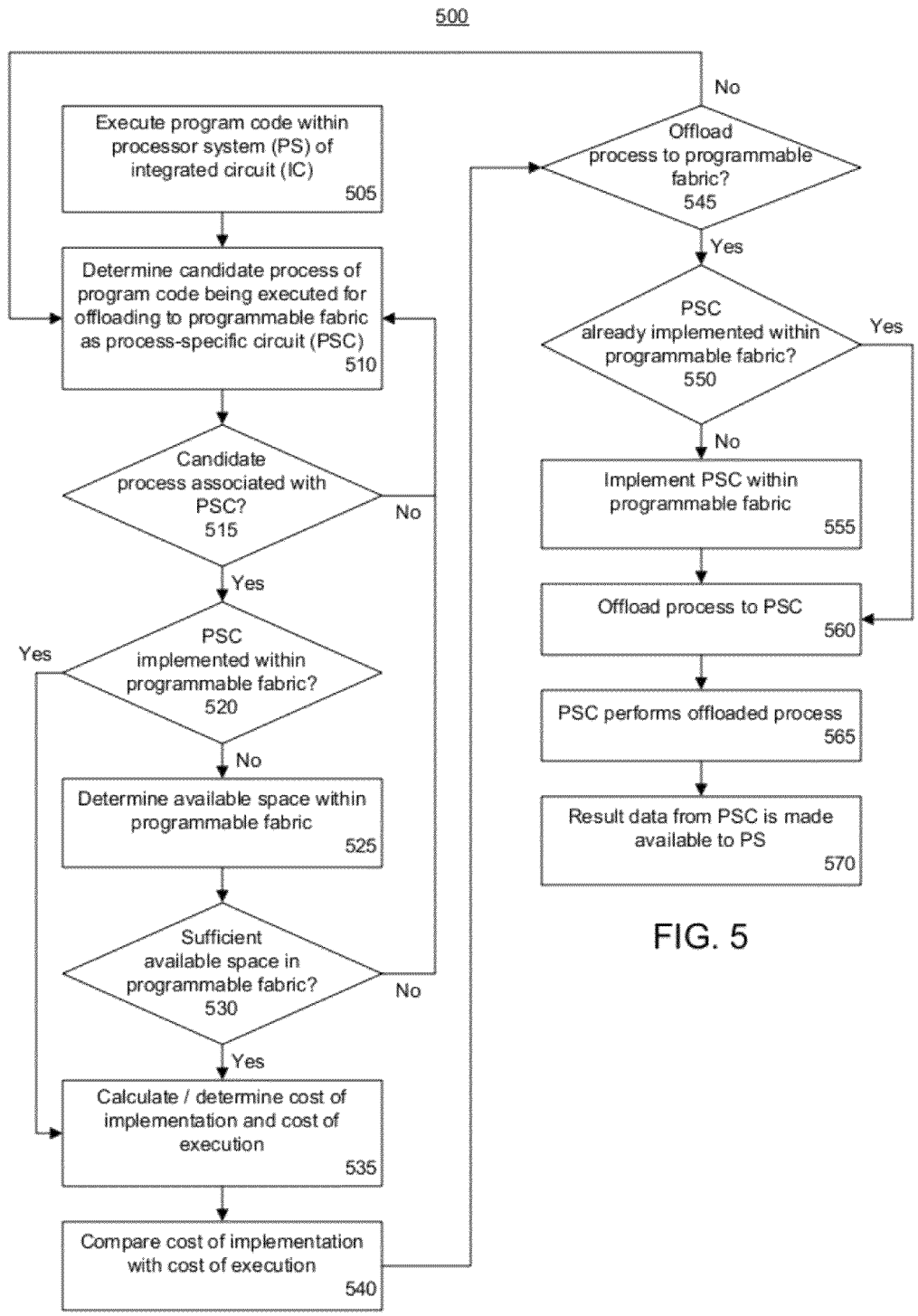
FIG. 5 is a first flow chart illustrating a method of extending a processor system within an IC in accordance with another embodiment disclosed within this specification.

FIG. 5 is a flow chart illustrating a method 500 of extending a processor system within an IC in accordance with another embodiment disclosed within this specification. Method 500 can be implemented by an IC as described within this specification, e.g., one that includes a PS coupled with a programmable fabric. Method 500 generally illustrates a technique for extending a PS during operation of the IC in a dynamic fashion that can be applied in the field. It should be appreciated, however, that the various costs described and techniques for selecting one process over another for implementation within the programmable fabric also can be applied during development of a system to "hard-code" such decisions into the program code executed by the PS and/or decide which processes should be handled by the PS and which should be implemented as PSCs, e.g., whether as I/O peripherals, interrupt handlers, or the like.

In an embodiment in which the PS determines which processes to implement dynamically, e.g., during operation and at runtime in the field, the program code executed by the PS can include the intelligence and decision making described with reference to FIG. 5. Further, the various quantities used in terms of profiling software processes and the PSCs that implement the software processes can be stored as part of the program code executing within the PS, stored elsewhere within the IC in a manner that is accessible by the PS during execution of the program code, or calculated at or during runtime.

Accordingly, method 500 can begin in step 505, where the PS of the IC is executing program code. As noted, the program code can include a plurality of different processes. One or more of the processes can be offloaded to the programmable fabric. The program code that is executed by the PS further can include the functionality described with reference to FIG. 5 in selecting processes for offloading and determining when to offload such processes.

In step 510, the PS can determine a candidate process of the program code being executed for offloading to the programmable fabric as a PSC. In an embodiment, the PS can identify one or more processes that are expected to be executed within a predetermined amount of time, e.g., the next process to be executed, a process within the next "N" processes where N is a predetermined integer value, or a process that is estimated to be executed within a predetermined number of clock cycles in the future. For example, the PS can utilize a look-ahead function that selects the candidate process.

In step 515, the PS can determine whether the candidate process is associated with a PSC. When the candidate process is associated with PSC, method 500 can continue. When the candidate process is not associated with a PSC, method 500 can loop back to select a different candidate process.

In step 520, the PS can determine whether the PSC is implemented within the programmable fabric. One or more PSCs may already be implemented within the programmable fabric. When the PSC is already implemented within the programmable fabric, the time component and the power component of the cost of implementation will be less than had the PSC require implementation within the programmable fabric prior to offloading. When the PSC is not yet implemented within the programmable fabric, the time component and the cost component of the cost of implementation each will be larger than had the PSC already been implemented within the programmable fabric. Further, the PS must determine whether sufficient available space exists within the programmable fabric for implementation of the PSC. Accordingly, when the PSC is implemented within the programmable fabric, method 500 can continue to step 535. When the PSC is not implemented within the programmable fabric, method 500 can continue to step 525.

In step 525, the PS can determine the amount of available space within the programmable fabric. As noted, the amount of available space can be the amount of unused programmable fabric that is available to implement further circuit designs such as the PSC. In step 530, the PS can determine whether the amount of available space within the programmable fabric is sufficient to implement the PSC. When there is sufficient available space within the programmable fabric to implement the PSC, method 500 can proceed to step 535. When there is not sufficient available space within the programmable fabric to implement the PSC, method 500 can loop back to step 510 to select a different candidate process for offloading, if any.

In step 535, the PS can calculate or determine the cost of implementation of the PSC and the cost of execution of the process within the PS. As noted, if desired, the cost of execution and the cost of implementation can reflect one or more time component(s), one or more power component(s), or a combination of one or more time component(s) and one or more power component(s). Whether time, power, or both are considered, a function can be used to weight the various components incorporated into the cost of implementation calculation. For example, within the cost of implementation calculation, time can be weighted more heavily, e.g., given greater importance, than power. Alternatively, power can be weighted more heavily than time. A different function can be used to weight the various cost components incorporated into the cost of execution calculation.

In another embodiment, multiple functions for computing the cost of implementation and/or cost of execution can be stored that value time, power, or a combination thereof differently. A particular function for computing cost of implementation and/or cost of execution can be selected dynamically by the PS according to an operating state, operating context, or other instruction provided to the IC during operation in the field. Thus, by changing the cost of implementation calculation and/or the cost of execution calculation in the field, the way in which the decision to offload a given process is made can be changed from time-to-time dynamically.

In still another embodiment, it should be appreciated that the available space determination can be incorporated into the cost of implementation determination step. For example, the determination of whether the programmable fabric includes sufficient available space can be incorporated directly into the cost of implementation as a binary type of variable that can override any result yielded by the cost of implementation calculation. In another example, when insufficient space is available within the programmable fabric to implement the PSC, a multiplier can be used that is large enough to ensure that the PSC is not implemented within the programmable fabric as the cost of implementation is certain to be larger than the cost of execution.

As noted, the cost of implementation and the cost of execution generally can be known or determined during the design process and specified within the program code. One or more cost components, however, can vary according to the current operating state of the IC including, but not limited to, the amount of available space within the programmable fabric of the IC and whether the particular process being evaluated is already implemented within the programmable fabric as a PSC. As noted, the PS further can select a particular manner or function for determining cost of implementation and/or cost of execution.

In step 540, the PS can compare the cost of implementation with the cost of execution. In step 545, the PS can determine whether to offload the process to the programmable fabric. When the cost of execution exceeds the cost of implementation or exceeds the cost of implementation by a percentage or a predetermined amount, the PS can determine that offloading of the process to the programmable fabric is worthwhile and is to be performed. When the process is not offloaded to the programmable fabric, method 500 loops back to step 510 to evaluate one or more additional processes that are part of the program code being executed. When the process is to be offloaded, method 500 can proceed to step 550.

In step 550, the PS can determine whether the PSC is implemented within the programmable fabric. Step 550 is shown for purposes of clarity and illustration but need not be performed as a separate processing step since the information is already known to PS, e.g., from step 520. Step 550 is shown, for example, to illustrate that when the PSC is not implemented within the programmable fabric, a configuration process must be performed to implement the PSC.

In any case, when the process is already implemented within the programmable fabric as a PSC, method 500 can proceed to step 560. When the process is not yet implemented within the programmable fabric as a PSC, method 500 can proceed to step 555. In step 555, the PSC is implemented within the programmable fabric. The PSC can be implemented through the loading of configuration data that specifies the PSC to be implemented. In an embodiment, configuration of the programmable fabric can be controlled, e.g., initiated, by the PS. For example, the PS can load the configuration data into the IC from an external source and provide the configuration data to the configuration controller. As noted, the programmable fabric can be entirely reconfigured or a portion of the programmable fabric can undergo dynamic partial reconfiguration. Once configuration of the programmable fabric is complete, the PSC is physically implemented therein.

In step 560, the PS can offload the process to the PSC. In step 565, the PSC can perform the offloaded process. Accordingly, in step 570, any result data generated by the PSC in performance of the offloaded process can be made available to the PS.

Figure 6:
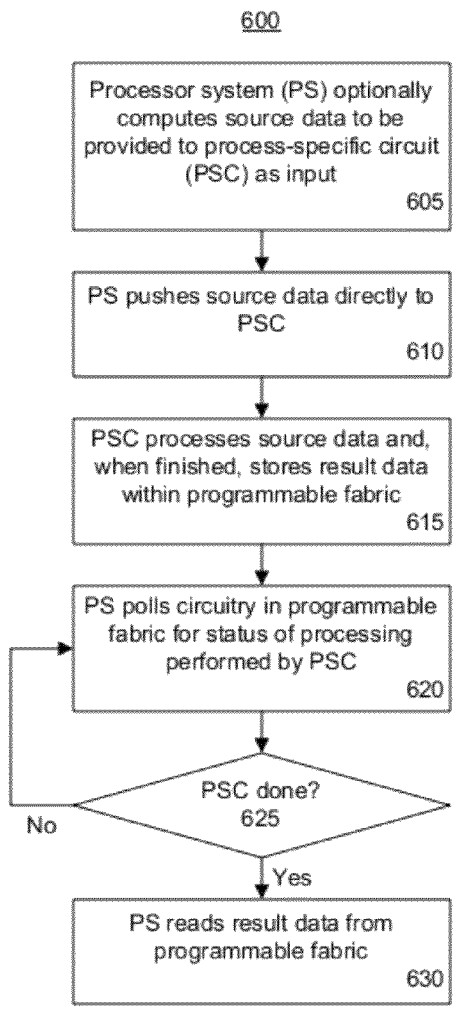
FIG. 6 is a second flow chart illustrating a method of offloading a process to circuitry implemented within programmable fabric of an IC in accordance with another embodiment disclosed within this specification.
Figure 7:
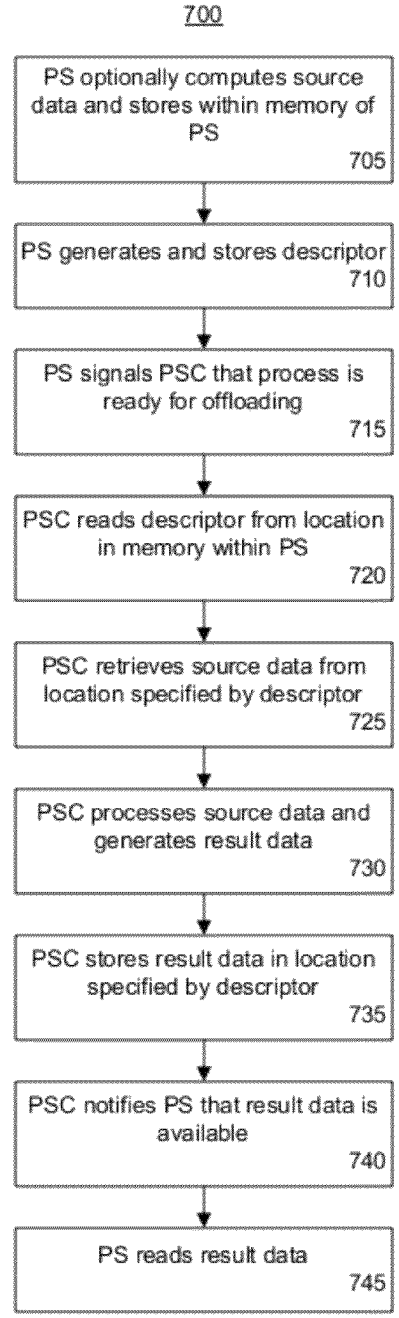
FIG. 7 is a third flow chart illustrating a method of offloading a process to circuitry implemented within programmable fabric of an IC in accordance with another embodiment disclosed within this specification.
Figure 8:
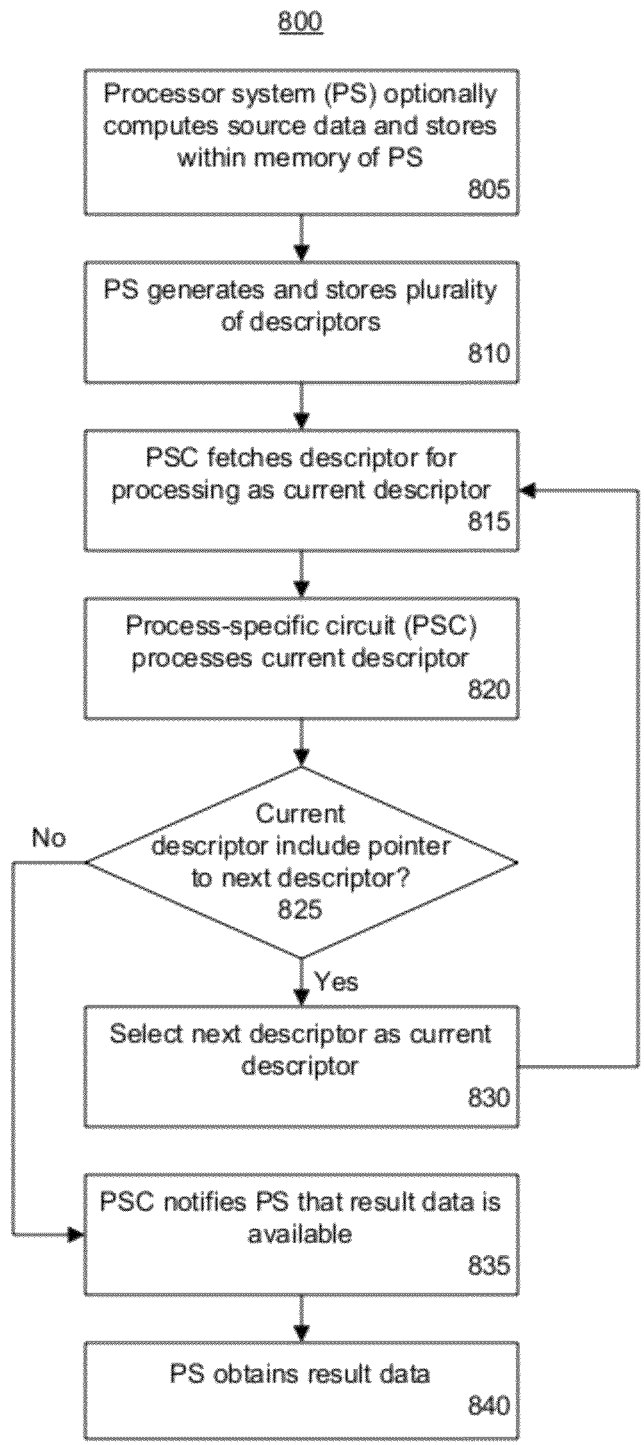
FIG. 8 is a fourth flow chart illustrating a method of offloading a process to circuitry implemented within programmable fabric of an IC in accordance with another embodiment disclosed within this specification.

FIGS. 6-8 illustrate various techniques for implementing the offloading of a process to circuitry within the programmable fabric of the IC. Each of FIGS. 6-8 can be implemented using an IC as described within this specification. Each of FIGS. 6-8 can begin in a state where the determination to offload the process to the programmable fabric has been made and, further, that the PSC within the programmable fabric has been implemented.

FIG. 6 is a second flow chart illustrating a method 600 of offloading a process to circuitry implemented within programmable fabric of an IC. FIG. 6 illustrates a case in which offloading is driven largely, if not completely, by the PS. Method 600 illustrates a use case that can be applied when the process to be offloaded is highly complex and operates on a relatively small set of data. In the example illustrated in FIG. 6, data is pushed from the PS to the programmable fabric and results are obtained by the PS from the programmable fabric.

In step 605, the PS optionally can compute source data to be provided to the process-specific circuit as input. In step 610, the PS can push the source data directly to the PSC. For example, the PS can push the source data via a slave interface such as interface 256B, set up a DMA to push the source data to the PSC, or send data via the FMIO interface 252 to the PSC. In step 615, the PSC can process the source data. When the PSC does finish processing of the source data, the PSC can store any result data that is generated at a memory location within the programmable fabric for retrieval by the PS.

In step 620, the PS can poll circuitry within the programmable fabric to determine when the PSC has completed processing of the source data. For example, the processor can poll a particular register within the programmable fabric that indicates the status of the PSC as busy or free. The register can be part of the PSC or can be external to the PSC, but still be located within the programmable fabric. A busy status indicates that the PSC is not finished processing the source data. A free status indicates that the PSC has completed processing of the source data and/or that result data is available.

In step 625, the PS can determine the status of the PSC. When done, result data is available and method 600 can proceed to step 630. When not done, the PSC is not finished processing the source data and method 600 can loop back to step 620 to continue polling the PSC status. Continuing to step 630, when result data is available, the PS can read the result data from a memory within the programmable fabric. Data can be read, for example, through a DMA transfer or the like.

FIG. 7 is a third flow chart illustrating a method 700 of offloading a process to circuitry implemented within programmable fabric of an IC. Whereas FIG. 6 illustrates an offloading technique that is driven by the PS, FIG. 7 illustrates an example in which a tighter level of integration exists between the PS and the PSC. Accordingly, in step 705, the PS optionally can compute any source data to be provided to the PSC as input for computation. In an embodiment, when the process to be offloaded requires source data as input, the PS can calculate or obtain that source data. To facilitate tighter integration with the programmable fabric, the PS can store the source data at a memory location within a memory that is internal to the PS. For example, once computed, the source data can be stored at an address within the OCM, the L1 cache, or the L2 cache.

In step 710, the PS can generate and store a descriptor. The descriptor can be a block or segment of memory that includes references and/or instructions for the PSC to implement or perform the process to be offloaded. Like the source data, the descriptor can be stored in the OCM, the L1 cache, or the L2 cache. The descriptor can include pointers or references to the source data, an instruction as to where to store the result data, e.g., which address and memory, etc.

In an embodiment, when generating the descriptor, the PS can perform address translation to translate virtual addresses to physical addresses and vice versa. In general, the PS can understand or interpret virtual addresses. The programmable fabric, inclusive of any circuitry implemented therein, however, cannot translate physical addresses to virtual addresses or vice versa. The programmable fabric understands only physical addresses. As such, any addresses specified within the descriptor must be specified as a physical address for use by the programmable fabric.

In step 715, the PS can notify the PSC that a process is ready for offloading. The notification can indicate, for example, that source data is available for processing by the PSC. The PS can notify the PSC using any of a variety of different mechanisms. For example, the PS can write, via one of the interfaces 256 or FMIO interface 252, to a register within the programmable fabric that is monitored by the PSC or a register within the PSC itself. In step 720, responsive to the PSC determining that the register is written or is written with a particular value, the PSC can read the descriptor from the memory within the processor. For example, the PSC can be configured to read a particular memory address within the PS where descriptors are to be stored or located when the register is written for notification purposes.

In step 725, the PSC can retrieve, or read, the source data specified by the descriptor. In step 730, the PSC can process the source data and generate or output result data. In step 735, the PSC can store the result data in the location specified by the descriptor. The result data also can be stored in an internal memory of the PS, e.g., the OCM, L1 cache, or L2 cache.

In step 740, the PSC can notify the PS that result data is available. For example, the PSC can write to an address of internal memory that is monitored by the PS, e.g., an address within the OCM, L2 cache, or L2 cache. In an embodiment, the address to which the notification is written or provided also can be specified by the descriptor. When the PS determines that the memory address has been written, e.g., with a value indicating that result data is ready from the PSC, the PS can read the result data from the location to which the PSC stored the result data as specified by the descriptor. It should be appreciated that cache coherency can be achieved when particular ports, e.g., interface 256C, are used. Other interfaces, e.g., interface 256A, 256B, and/or 256D may not provide access to caches or internal memories of the PS. In step 745, the PS can retrieve or read the result data.

It should be appreciated that the use of descriptors allows the location to which the source data and any result data are stored to be changed even though a same PSC is being called each time. The PSC can read the physical addresses specified by the descriptor to obtain source data from the enumerated location and to store result data at the enumerated location. Such locations can be different across each of a plurality of descriptors intended for a same PSC or for different PSCs.

FIG. 8 is a fourth flow chart illustrating a method 800 of offloading a process to circuitry implemented within programmable fabric of an IC. FIG. 8 illustrates an offloading mechanism in which the PS can utilize the PSC to implement a plurality of fine-grained operations of a process without being overwhelmed by transaction setup and activities such as handshaking between the PSC and the PS. FIG. 8 illustrates an alternative mechanism to FIG. 7 that also leverages the use of descriptors. In general, a plurality of descriptors can be provided to the PSC. The PSC can execute each of the descriptors in serial fashion uninterrupted as described below.

In step 805, the PS optionally can compute any source data to be provided to the PSC as input for computation. As noted, once computed, the source data can be stored within the OCM, L1 cache, or L2 cache. In another embodiment, the source data can be stored within a memory located in the programmable fabric of the IC.

In step 810, the PS can generate and store a plurality of descriptors. Each descriptor can be a block or segment of memory that includes references and/or instructions for the PSC to implement or perform the process to be offloaded. In an embodiment, the PS can store the plurality of descriptors within one of the internal memories of the PS. In another embodiment, the PS can store the plurality of descriptors within a memory such as a queue within the programmable fabric that is accessible by the PSC or within the PSC.

As noted, each descriptor can specify a location, e.g., physical memory address, from which to obtain any source data to be used as input and a location to which any result data should be stored. To effectuate the processing of the plurality of descriptors, in addition to the information noted previously, each descriptor can include or specify a pointer to the next descriptor in the plurality of descriptors forming a linked chain of descriptors. The last descriptor in the chain of descriptors can be characterized by the lack of a pointer to a next descriptor.

Additional information that can be specified within a descriptor can include, for example, an indicator for a computational step to be performed in hardware, buffer pointers from which to obtain data or to which data should be stored, mailboxes or register addresses for purposes of notification or communication with the PS. By using a plurality of descriptors as described, the PSC can continue processing until no further descriptors remain. For example, the PSC can be configured to detect when a descriptor is stored within a particular memory or within the queue. The PSC can continue to process each of the plurality of descriptors automatically without further instruction from the PS until the last descriptor is processed. This arrangement requires setup for processing of the first descriptor in the plurality of descriptors. Setup for subsequent descriptors, however, is minimized or eliminated.

In step 815, the PSC can fetch a descriptor of the plurality of descriptors. For example, the PSC can be configured to check a predetermined memory location for the existence of a first descriptor of the plurality of descriptors generated and stored by the PS. The PSC can fetch the descriptor for processing as the current descriptor. In step 820, the PSC can process the current descriptor. For example, the PSC can retrieve any specified source data, process the source data to generate result data, and store the result data as indicated by the current descriptor.

In step 825, the PSC can determine whether further descriptors remain to be processed. For example, the PSC can determine whether the current descriptor specifies a pointer to a next descriptor. When the current descriptor specifies a pointer to a next descriptor, the PSC can continue to step 830. In step 830, the PSC selects the next descriptor as specified by the pointer and loops back to step 815. When the current descriptor does not specify a pointer to the next descriptor, the PSC determines that the current descriptor is the last descriptor. Accordingly, the PSC can discontinue processing descriptors and continue to step 835.

In step 835, when the PSC completes processing of each of the plurality of descriptors, the PSC can notify the PS that result data is available. In an embodiment, the PSC, responsive to completing processing of the descriptors, can store the result data in a particular location from which the PS can retrieve the result data. That location can differ from the intermediate location(s) at which result data from one or more individual ones of the descriptors may be stored.

Responsive to receiving the indication, the PS can obtain the result data. For example, the PS can execute a separate thread thereby allowing the PS to perform other tasks while awaiting the availability of the result data from the PSC. In another embodiment, the PS can utilize a mailbox, semaphore, or interrupts to notify the PS.

In general, using an inappropriate technique for offloading a process can result in any savings in time and/or power being overwhelmed by logistical operations such as providing the source data to the programmable fabric or constant polling. In this regard, when computing the cost of implementation, it should be appreciated that the cost of implementation will vary with the particular technique used to offload the process to the programmable fabric. Thus, for example, the cost of implementation of a selected process will vary according to whether the offloading is performed using the method of FIG. 6, FIG. 7, or FIG. 8.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of extending a processor system within an integrated circuit, the method comprising:
    executing program code within the processor system implemented within the integrated circuit, wherein the integrated circuit comprises a programmable fabric, and wherein the processor system is coupled to the programmable fabric;
    wherein a process-specific circuit implemented within the programmable fabric is unable to translate virtual memory addresses to physical memory addresses;
    the processor system storing a plurality of descriptors in a memory with each descriptor comprising a first physical memory address and a second physical memory address, wherein each of the plurality of descriptors specifies a different second physical memory address;
    wherein the processor system translates virtual memory addresses into the first and second physical memory addresses for the plurality of descriptors;
    for each descriptor of the plurality of descriptors, performing a process using the process-specific circuit implemented within the programmable fabric in lieu of using the processor system by operating on source data indicated by the first physical memory address and storing a result of the process at the second physical memory address of the descriptor.

2. The method of claim 1, wherein a descriptor of the plurality of descriptors specifies a third physical memory address written by the process-specific circuit responsive to completion of processing indicating, to the processor system, completion of processing by the process-specific circuit.

3. The method of claim 1, wherein a first descriptor of the plurality of descriptors specifies a physical memory address for a second descriptor of the plurality of descriptors, the method further comprising:
    the process-specific circuit discontinuing processing responsive to determining that a source data currently processed includes no pointer to a next descriptor.

4. The method of claim 1, further comprising:
    determining whether to perform the process using the process-specific circuit according to reduction in completion time attained through implementation of the process using the process-specific circuit in lieu of using the processor system.

5. The method of claim 1, wherein each of the plurality of descriptors further specifies a memory of a plurality of memories where the result for the descriptor is stored.

6. The method of claim 1, wherein each of the plurality of descriptors specifies a different first physical memory address.

7. The method of claim 1, further comprising:
    estimating an amount of space in the programmable fabric needed to implement the process-specific circuit according to a number of lines of program code of the process to be offloaded from the processor system to the process-specific circuit;
    wherein the process-specific circuit is only implemented responsive to determining that an amount of available space within the programmable fabric is sufficient for the amount of space in the programmable fabric needed to implement the process-specific circuit.

8. The method of claim 1, further comprising:
    determining whether to offload the process from the processor system to the process-specific circuit according to a function for computing cost of offloading the process, wherein the function is selected from a plurality of different functions for computing cost responsive to an operating state within the processor system during in field operation.

9. A method of extending a processor system within an integrated circuit, the method comprising:
    executing program code within a processor system, wherein the program code specifies a plurality of processes;
    selecting a process from the plurality of processes specified by the program code;
    selecting configuration data specifying a process-specific circuit that implements, in hardware, the selected process;
    loading the selected configuration data to implement the process-specific circuit within a programmable fabric of the integrated circuit;
    the processor system translating virtual memory addresses usable by the processor into physical memory addresses usable by the process-specific circuit;
    wherein the process-specific circuit is unable to translate the virtual memory address to the physical memory address;
    the processor system storing a plurality of descriptors in a memory accessible by the process-specific circuit, wherein each descriptor specifies a first physical memory address and a second physical memory address, wherein each of the plurality of descriptors specifies a different second physical memory address; and for each descriptor of the plurality of descriptors, performing the selected process using the process-specific circuit in lieu of the processor system by operating on source data indicated by the first physical memory address and storing a result of the selected process at the second physical memory address of the descriptor.

10. The method of claim 9, wherein each of the plurality of descriptors specifies a different first physical memory address.

11. The method of claim 9, wherein a first descriptor of the plurality of descriptors specifies a physical memory address for a second descriptor of the plurality of descriptors, the method further comprising:

the process-specific circuit discontinuing processing responsive to determining that a source data currently processed includes no pointer to a next descriptor.

12. The method of claim 9, wherein each of the plurality of descriptors further specifies a memory of a plurality of memories where the result for the descriptor is stored.

13. An integrated circuit comprising:

a processor system configured to execute program code; and a process-specific circuit implemented within a programmable circuitry of the integrated circuit, wherein the process-specific circuit is coupled to the processor system and is configured to implement a process that is offloaded by the processor system;

wherein the processor system is programmed to:

store a plurality of descriptors in a memory accessible by the process-specific circuit, wherein each descriptor specifies a first physical memory address and a second physical memory address, wherein each descriptor specifies a different second physical memory address;

wherein the processor system translates virtual memory addresses into the first and second physical memory addresses for the plurality of descriptors; and offload the process to the process-specific circuit in lieu of executing program code to perform the process;

wherein the process-specific circuit is configured to:

access a predetermined memory location where a first descriptor of the plurality of descriptors is stored; and for each descriptor of the plurality of descriptors, perform the process using the process-specific circuit implemented within the programmable fabric in lieu of using the processor system by operating on source data indicated by the first physical memory address and storing a result of the process at the second physical memory address of the descriptor.

14. The integrated circuit of claim 13, wherein a descriptor of the plurality of descriptors specifies a third physical memory address written by the processor-specific circuit responsive to completion of processing indicating, to the processor system, completion of processing by the process-specific circuit.

15. The integrated circuit of claim 13, wherein the process-specific circuit is unable to translate virtual memory addresses to physical memory addresses.

16. The integrated circuit of claim 13, wherein the processor system is further configured to determine whether to offload the process to the process-specific circuit by:

estimating an amount of space in the programmable fabric needed to implement the process-specific circuit according to a number of lines of program code of the process to be offloaded from the processor system to the process-specific circuit;

wherein the process-specific circuit is only implemented responsive to determining that an amount of available space within the programmable fabric is sufficient for the amount of space in the programmable fabric needed to implement the process-specific circuit.

17. The integrated circuit of claim 13, wherein each of the plurality of descriptors specifies a different first physical memory address.

18. The integrated circuit of claim 15, wherein each of the plurality of descriptors further specifies a memory of a plurality of memories where the result for the descriptor is stored.

19. The integrated circuit of claim 13, wherein:

a first descriptor of the plurality of descriptors specifies a physical memory address for a second descriptor of the plurality of descriptors; and the process-specific circuit discontinues processing responsive to determining that a source data currently processed includes no pointer to a next descriptor.

20. The integrated circuit of claim 13, wherein the processor system determines whether to offload the process from the processor system to the process-specific circuit according to a function for computing cost of offloading the process, wherein the function is selected from a plurality of different functions for computing cost responsive to an operating state within the processor system during in field operation.

* * * * *